(12) United States Patent
Gonzalez et al.

(10) Patent No.: US 6,724,148 B1
(45) Date of Patent: Apr. 20, 2004

(54) MECHANISM FOR MINIMIZING ION BOMBARDMENT ENERGY IN A PLASMA CHAMBER

(75) Inventors: Juan Jose Gonzalez, Fort Collins, CO (US); Andrew Shabalin, Fort Collins, CO (US); Fernando Gustavo Tomasel, Fort Collins, CO (US)

(73) Assignee: Advanced Energy Industries, Inc., Fort Collins, CO (US)

(*) Notice: Subject to any disclaimer, the term of this patent is extended or adjusted under 35 U.S.C. 154(b) by 0 days.

(21) Appl. No.: 10/355,619

(22) Filed: Jan. 31, 2003

(51) Int. Cl.⁷ ................................................. H01J 7/24
(52) U.S. Cl. ............................ 315/111.21; 315/111.41
(58) Field of Search ....................... 315/111.21, 111.41, 315/111.51, 111.71

(56) References Cited

U.S. PATENT DOCUMENTS 6,011,704 A * 1/2000 Coleman ...................... 363/37
6,297,595 B1 * 10/2001 Stimson et al. .......... 315/111.51

* cited by examiner

*Primary Examiner*—David Vu
(74) *Attorney, Agent, or Firm*—Blakely Sokoloff Taylor & Zafman LLP

(57) ABSTRACT

According to one embodiment, an apparatus is described. The apparatus includes a metal vacuum chamber with two or more dielectric breaks. It also includes a number of excitation transformers located so as to distribute the total induced voltage in the chamber among the dielectric breaks. Distributing the total induced voltage among the breaks results in lower wall damage and, consequently, longer lifetimes for the plasma chambers.

21 Claims, 4 Drawing Sheets

MECHANISM FOR MINIMIZING ION BOMBARDMENT ENERGY IN A PLASMA CHAMBER

FIELD OF THE INVENTION

The present invention relates to the field of remote plasma sources; more particularly, the present invention relates to transformer coupled plasma sources.

BACKGROUND

Transformer coupled plasmas are routinely used in a number of different applications including materials processing, production of activated gases, pollutant abatement and many others. In such devices, the magnetic core of the excitation transformer is placed in close proximity to, around or within a vacuum chamber. When the primary winding of this transformer is excited with radio frequency (RF), the electromagnetic fields induced around the core sustain a gas plasma discharge within the vacuum apparatus.

The vacuum chamber is often a metal vessel that includes a dielectric gap to avoid the creation of a closed current loop through the chamber. As the metallic chamber is highly conductive, most of the induced voltage along the chamber drops across this gap. Often, the drop is sufficiently high so as to generate a capacitive discharge across the dielectric gaps.

The capacitive discharge may cause arcs to occur between the plasma and the chamber walls, causing deterioration of the wall coating. In addition, during plasma operation, ions from the plasma may bombard the chamber wall, also resulting in deterioration of the wall because of the sputtering and a chemical reaction between energetic ions and wall material. Therefore, a mechanism to minimize capacitive discharge and ion bombardment of the wall of a plasma chamber is desired.

SUMMARY

According to one embodiment, an apparatus is described. The apparatus includes a metal vacuum chamber with two or more dielectric breaks. It also includes a number of excitation transformers located so as to distribute the total induced voltage in the chamber among the dielectric breaks. Distributing the total induced voltage among the breaks results in lower wall damage and, consequently, longer lifetimes for the plasma chambers.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

According to one embodiment, a mechanism for minimizing ion bombardment in a transformer coupled plasma chamber is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
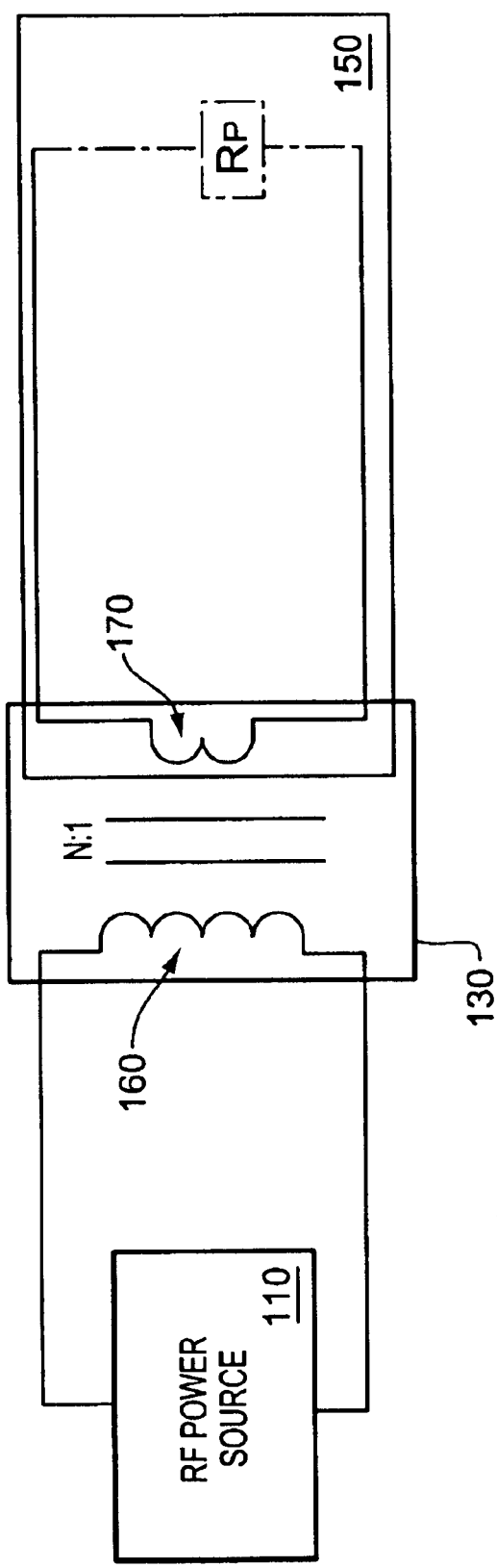
FIG. 1 illustrates an electrical representation of an exemplary plasma source coupled to an RF power generator.

FIG. 1 illustrates an electrical representation of an exemplary TCP apparatus. The apparatus includes a RF power supply 110, a transformer 130 and a plasma chamber 150. The primary winding 160 of transformer is coupled to the RF power supply. The secondary winding 170 along with the resistance Rp represent the plasma load.

Figure 2:
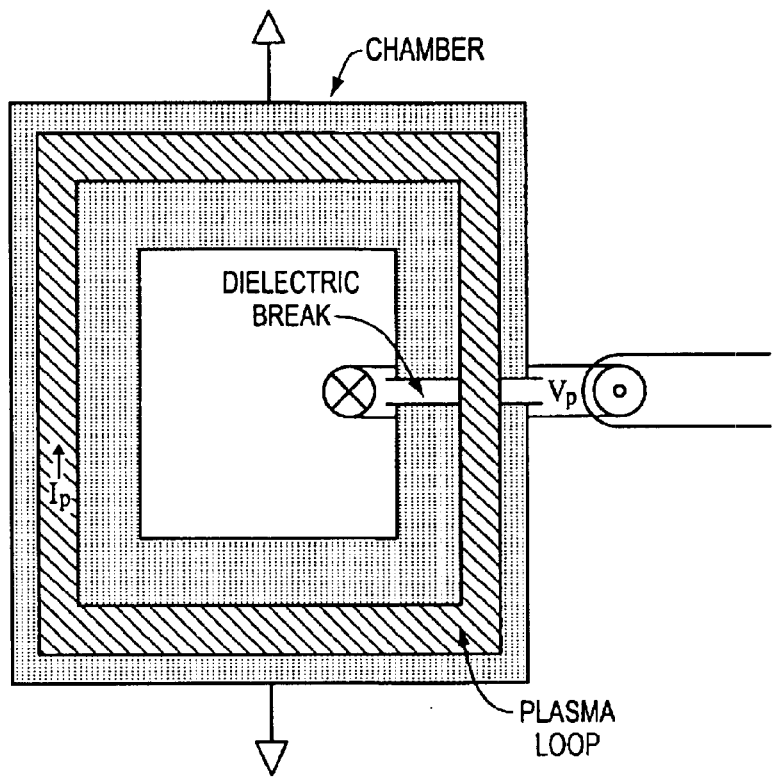
FIG. 2 illustrates an example of a chamber configuration.

FIG. 2 illustrates an exemplary one-gap, one-transformer plasma source chamber configuration of the TCP apparatus shown in FIG. 1. The chamber includes a transformer with primary and secondary windings, a dielectric break and a plasma loop. During chamber operation, the RF excitation on the primary winding of the transformer creates an induced electric field around the transformer core.

By Faraday's induction law, for any closed path the total voltage drop associated with this induced electric field is proportional to the net magnetic flux enclosed by the path. Within the vacuum chamber, the induced electric field drives the discharge current Ip in a closed loop. The total voltage drop Vp associated with the induced electric field within the chamber is uniformly distributed along the plasma loop.

For a closed path following the perimeter of the chamber and across the dielectric break the total flux enclosed is the same as that enclosed by the plasma loop, so the value of the total voltage drop is in both cases the same and equal to Vp. However, since the highly conductive metal forces the electric to be zero in the metallic walls, the total voltage drop Vp appears across the dielectric break.

The voltage appearing across the dielectric gap may cause arcs to occur between the plasma and the chamber walls, causing deterioration of the wall surface. In addition, during plasma operation, ions from the plasma are accelerated by this potential drop, bombarding the chamber wall and increasing the deterioration of the wall through sputtering and enhanced chemical reactions between the energetic ions and the wall material. The deterioration increases as the voltage at the gap increases. Consequently, is it desirable to reduce the voltage in the gap while keeping the driving voltage in the plasma unchanged.

Since the voltage along the perimeter of the chamber wall and across the dielectric breaks that the chamber may have is equal to the plasma voltage Vp, the introduction of more than one dielectric gap could be a means to reduce the voltage drop per gap. However, as described below, the success of this approach depends on the position of the gaps relative to the excitation transformers, and the grounding of the plasma chamber.

Figure 3:
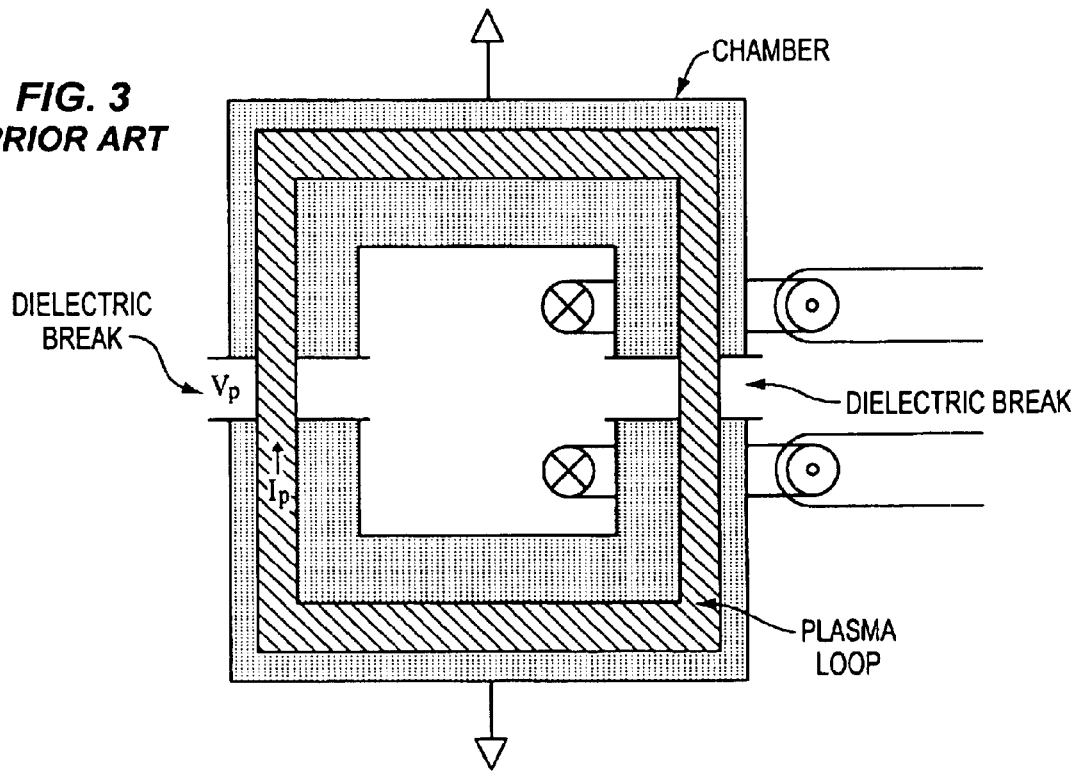
FIG. 3 illustrates a second example of a chamber configuration.

FIG. 3 illustrates an exemplary two-gap, two-transformer plasma source chamber configuration. To allow for comparison with the case of a single gap, each of the transformers is assumed to induce a voltage drop equal to Vp/2 along the plasma loop, so the total loop voltage is also Vp. However, the grounding requirements for the chamber do not allow for an even distribution of the total voltage Vp between the two gaps.

Typically, the chamber is grounded at the top because of the presence of a gas feed line, and at the bottom because of the pumping line. Grounding both sections and having both transformers close to one of the dielectric gaps results in short circuit across the remaining gap and in the appearance of the full voltage drop Vp across the gap closer to the transformer cores.

This conclusion is easy to verify by following a closed path that starts at one edge of the dielectric break on the right, follows the chamber to the upper ground connection, returns by the lower ground connection and goes back to the beginning. Such a path encloses the total magnetic flux of both transformers, so the voltage drop across the dielectric break is equal to the total voltage drop. Consequently, although this configuration features two gaps, there is no split in the voltage between the dielectric breaks. In regard to ion bombardment and wall deterioration, this configuration is essentially equivalent to the one presented in FIG. 2.

Figure 4:
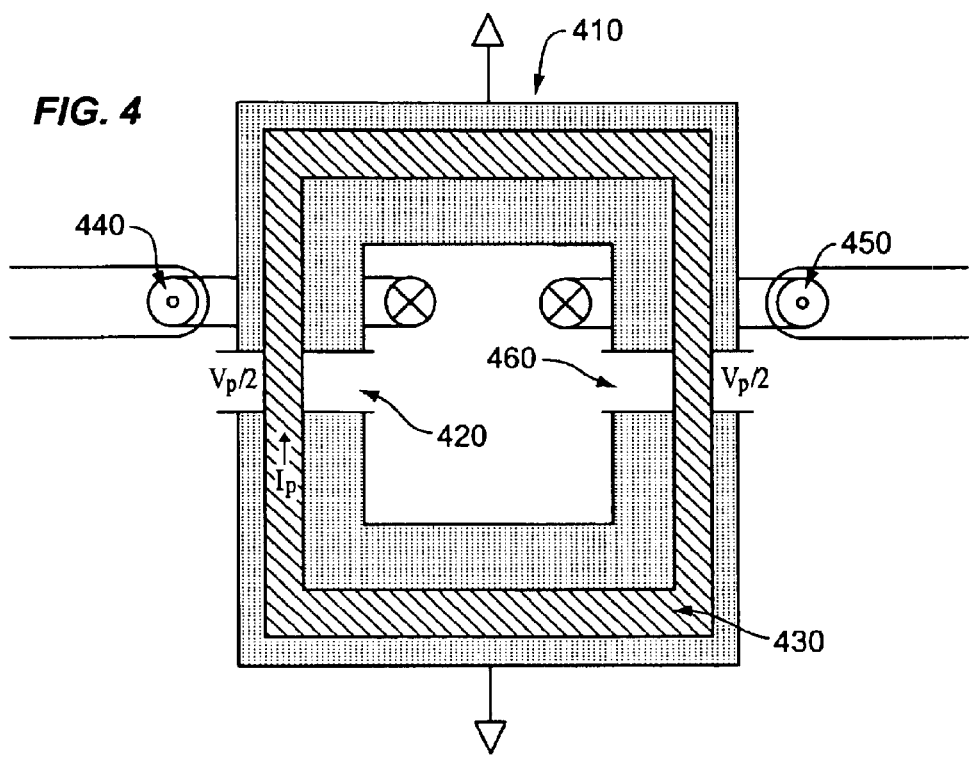
FIG. 4 illustrates one embodiment of a chamber configuration.

According to one embodiment, the present invention describes a mechanism to distribute the voltage drop among two or more dielectric breaks, thus reducing the ion bombardment and deterioration of the chamber wall close to the gaps. FIG. 4 illustrates one embodiment of a plasma source chamber 510.

Referring to FIG. 4, chamber 410 includes dielectric breaks 420 and 460, plasma loop 430, and transformers 440 and 450. Transformer 440 is located on the region of chamber 410 next to dielectric break 420, while transformer 450 is located next to dielectric break 460. The transformers are positioned such that the magnetic flux within their cores is directed as indicated in the figure. The crosses and dots drawn inside the cross section of the cores indicate magnetic flows entering and exiting the page, respectively.

During operation, a closed current loop 430 of intensity Ip is established within the chamber. Once again, and to allow comparison with the case of a single gap, each of the transformers is assumed to induce a closed loop voltage equal to Vp/2, so the total voltage drop in the plasma due the combined effects of both transformers is equal to Vp.

In contrast to the case depicted in FIG. 3, the disposition shown in FIG. 4 makes the voltage drop on each gap equal to Vp/2, even when both sections of the chamber are grounded. This conclusion is easy to verify by following a closed path that starts at one edge of the dielectric break on the right, follows the chamber to the upper ground connection, returns by the lower ground connection and goes back to the beginning. Such a path encloses the magnetic flux of only one transformer, so the voltage drop across the dielectric break is equal to one half of the total voltage drop.

Thus, the voltage is evenly split between dielectric breaks 420 and 460 by the use of a transformer on each side of chamber 410. By dividing the voltage between dielectric breaks 420 and 460, the energy of the bombarding ions is diminished, mitigating the deterioration of the chamber wall surface and resulting in extended lifetime for the chamber.

Figure 5:
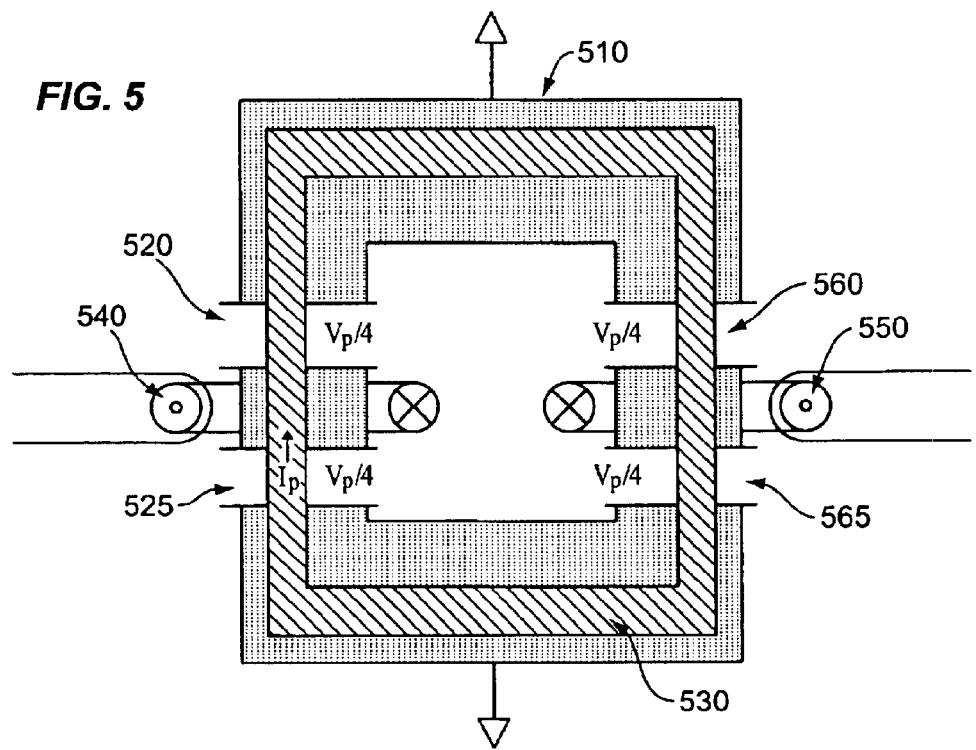
FIG. 5 illustrates another embodiment of a chamber configuration.

FIG. 5 illustrates another embodiment of a plasma source chamber. In this embodiment, plasma source 130 comprises a chamber 510. Chamber 510 includes dielectric breaks 520, 525, 560 and 565, plasma loop 530, and transformers 540 and 550. Transformer 540 is located on the region of chamber 510 between dielectric breaks 520 and 525, while transformer 550 is located between dielectric breaks 560 and 565. Each of the transformers induces a closed loop voltage equal to Vp/2, so the total voltage drop in the plasma due the combined effects of both transformers is equal to Vp. The chamber 510 is grounded at the top and bottom.

When compared to chamber 410, the configuration of chamber 510 further divides the total plasma voltage Vp, such that the voltage at each dielectric break is Vp/4. This conclusion is again easy to verify by following a closed path that starts at one edge of the upper dielectric break on the right, follows the chamber to the upper ground connection, returns by the lower ground connection and goes back to the beginning, crossing both gaps on the right side of the chamber. Since such a path encloses the magnetic flux of only one transformer and goes across two gaps, and given the symmetric configuration of each transformer with respect to the closest gaps, the voltage drop across each dielectric break is equal to one quarter of the total voltage drop.

By dividing the voltage between dielectric breaks 520, 525, 560 and 565, energy of the bombarding ions is reduced even further, diminishing the deterioration of the chamber wall surface. Although exemplified for the case of two transformers and two- and four-gap chambers, it is clear that the principle hereby described can be easily extended to the case of higher number of transformers and gaps.

Figure 6:
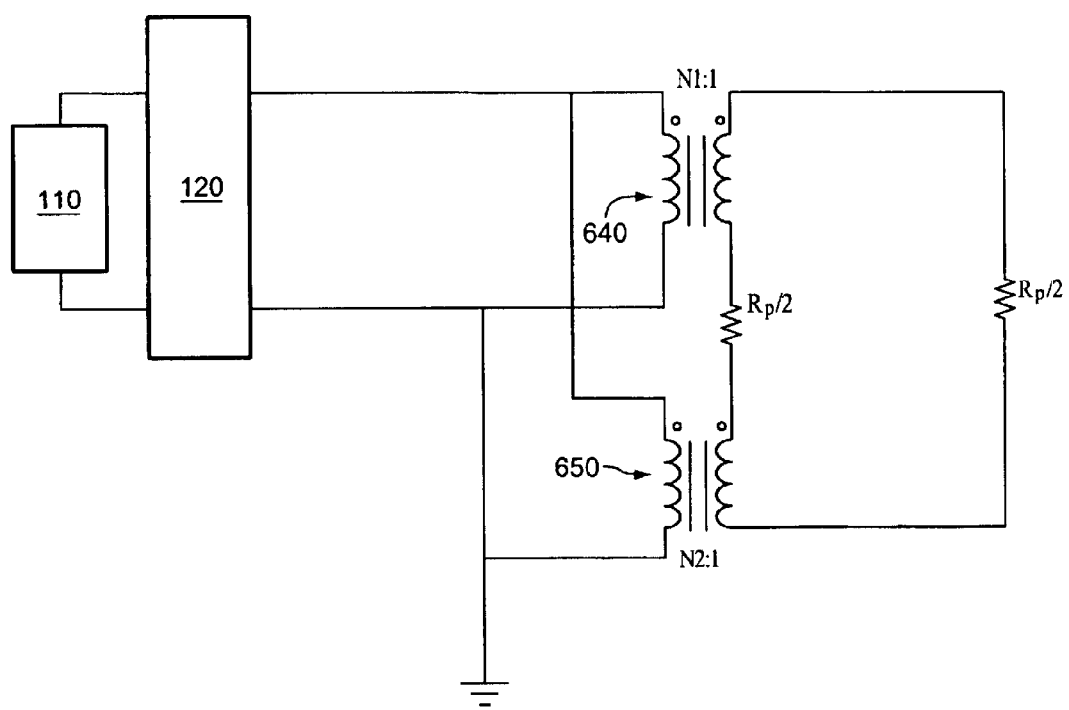
FIG. 6 illustrates an electrical representation of one embodiment of a plasma source.

FIG. 6 illustrates an electrical representation of one embodiment of a remote plasma source configuration for chamber 610. The RF generator 110 is coupled to the primary winding of transformers 640 and 650. According to one embodiment, transformers 640 and 650 are coupled in parallel and connected to ground. The secondary windings of the transformers and the resistances represent the plasma load. Two resistors in series now represent the total resistance of the plasma; each resistor is one half of the full loop plasma resistance.

According to a further embodiment, the transformer configuration shown in FIG. 6 is implemented to obtain a turn ratio (TR) equal to any given rational number. In traditional plasma sources, the TR is restricted to an integer value due to the requirement of a single turn secondary winding for the TCP.

However, by having the primary windings in parallel and the secondary windings in series, the present invention provides a way to obtain TR equal to any rational number, provided that the number of turns in the primary windings is suitable chosen. For example, in the case depicted in FIG. 6, the TR and the number of turns N1 and N2 must satisfy the relationship $TR=(1/N1+1/N2)^{-1}$.

As described above, the implementation of multiple transformers at multiple dielectric breaks distributes the plasma voltage among the dielectric breaks, thus minimizing the voltage drop at any particular dielectric break. Consequently, ion bombardment at each dielectric break is reduced, and damage to the chamber wall is diminished. In addition, turn ratios equal to any given rational number can be achieved by choosing primary windings of the multiple transformers with suitable number of turns and wiring them in parallel.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

Thus, a mechanism to minimize ion energy bombarding the wall of a plasma chamber has been described.

What is claimed is:

1. An apparatus comprising:

a metal vacuum chamber;

a first dielectric component forming a first break in the chamber;

a first electrical transformer coupled to the chamber next to the first break in the chamber to induce an electromagnetic field within the vacuum chamber;

a second dielectric component forming a second break in the chamber; and a second transformer coupled to the chamber next to the second break to induce an electromagnetic field within the vacuum chamber;

the first and second transformers configured such that a voltage applied to the vacuum chamber is divided between the first and second breaks in the chamber.

2. The apparatus of claim 1 wherein the voltage applied to the vacuum chamber is equally divided between the first and second breaks in the chamber.

3. The apparatus of claim 1 wherein the chamber comprises a plasma loop.

4. The apparatus of claim 3 wherein dividing the voltage between the first and second breaks in the chamber decreases the energy of the ions generated within the chamber.

5. The apparatus of claim 1 further comprising a power supply coupled to the primary winding of the transformer to supply power to the vacuum chamber.

6. The apparatus of claim 5 further comprising an impedance matching circuit coupled between the AC power source and the primary winding of the transformer to match the impedance range of the transformer to the output impedance range of the AC power source.

7. An apparatus comprising:

a metal vacuum chamber;

a first dielectric component forming a first break in the chamber;

a second dielectric component forming a second break in the chamber;

a first electrical transformer coupled to the chamber next to the first and second breaks in the chamber to induce an electromagnetic field within the vacuum chamber;

a third dielectric component forming a third break in the chamber; and a fourth dielectric component forming a fourth break in the chamber;

a second transformer coupled to the chamber next to the third and fourth breaks in the chamber to induce an electromagnetic field within the vacuum chamber;

the first and second transformers configured such that a voltage applied to the vacuum chamber is divided between the first, second, third and fourth breaks in the chamber.

8. The apparatus of claim 7 wherein the voltage applied to the vacuum chamber is equally divided between the first, second, third and fourth breaks in the chamber.

9. The apparatus of claim 7 wherein the chamber comprises a plasma loop.

10. The apparatus of claim 9 wherein dividing the voltage between the first and second breaks in the chamber divides the ion energy within the chamber.

11. The apparatus of claim 7 further comprising a power supply coupled to the primary winding of the transformer to supply power to the vacuum chamber.

12. The apparatus of claim 11 further comprising an impedance matching circuit coupled between the AC power source and the primary winding of the transformer to match the impedance range of the transformer to the output impedance range of the AC power source.

13. A plasma chamber comprising:

a plasma source;

a first dielectric component forming a first break in the chamber next to a first transformer; and a second dielectric component forming a second break in the chamber next to a second transformer, wherein a voltage applied to the chamber by the first and second transformers is divided between the first and second breaks in the chamber.

14. The plasma chamber of claim 13 wherein dividing the voltage between the first and second breaks in the chamber reduces energy of the ions, bombarding the walls.

15. The plasma chamber of claim 13 wherein the voltage applied to the plasma chamber is equally divided between the first and second breaks in the chamber.

16. A plasma chamber comprising:

a plasma source;

a first dielectric component forming a first break in the chamber next to a first transformer;

a second dielectric component forming a second break in the chamber next to the first transformer;

a third dielectric component forming a third break in the chamber next to a second transformer, and a fourth dielectric component forming a fourth break in the chamber next to the second transformer; wherein a voltage applied to the chamber by the first and second transformers is divided between the first, second third and fourth breaks in the chamber.

17. The plasma chamber of claim 16 wherein the voltage applied to the vacuum chamber is equally divided between the first, second, third and fourth breaks in the chamber.

18. The plasma chamber of claim 16 wherein dividing the voltage between the first and second breaks in the chamber reduces ion energy.

19. An apparatus comprising:

a vacuum chamber;

a first electrical transformer coupled to the chamber to induce an electromagnetic field within the vacuum chamber; and a second transformer coupled to the chamber to induce an electromagnetic field within the vacuum chamber;

the first and second electrical transformers each having:
a primary winding;
a plasma loop within the chamber that performs as a secondary winding;

wherein primary windings of the first and second transformers are coupled in parallel, and the secondary windings of the first and second transformers are coupled in series.

20. The apparatus of claim 19 further comprising:

a first dielectric component forming a first break in the chamber;

a second dielectric component forming a second break in the chamber;

wherein the first and second transformers are configured such that a voltage applied to the vacuum chamber is divided between the first and second breaks in the chamber.

21. The apparatus of claim 20 wherein the voltage applied to the vacuum chamber is equally divided between the first and second breaks in the chamber.

* * * * *